United States Patent
Hu et al.

(10) Patent No.: US 11,835,683 B2
(45) Date of Patent: Dec. 5, 2023

(54) TACTILE FEEDBACK MECHANISM

(71) Applicant: TDK TAIWAN CORP., Taoyuan (TW)

(72) Inventors: Chao-Chang Hu, Taoyuan (TW); Pai-Jui Cheng, Taoyuan (TW); Shu-Shan Chen, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 0 days.

(21) Appl. No.: 17/552,422

(22) Filed: Dec. 16, 2021

(65) Prior Publication Data

US 2022/0197386 A1 Jun. 23, 2022

Related U.S. Application Data

(60) Provisional application No. 63/127,746, filed on Dec. 18, 2020.

(51) Int. Cl.
| | | |
|---|---|---|
| G02B 13/00 | (2006.01) | |
| G02B 26/08 | (2006.01) | |
| G02B 7/09 | (2021.01) | |
| G02B 27/64 | (2006.01) | |
| G02B 26/00 | (2006.01) | |
| G02B 7/04 | (2021.01) | |
| G06F 3/01 | (2006.01) | |
| H10N 30/80 | (2023.01) | |
| H10N 30/00 | (2023.01) | |

(52) U.S. Cl.
CPC ........... *G02B 13/0015* (2013.01); *G02B 7/04* (2013.01); *G02B 7/09* (2013.01); *G02B 26/00* (2013.01); *G02B 26/0875* (2013.01); *G02B 27/64* (2013.01); *G02B 27/646* (2013.01); *G06F 3/016* (2013.01); *H10N 30/1071* (2023.02); *H10N 30/802* (2023.02)

(58) Field of Classification Search
CPC ... G06F 3/016; H01L 41/0825; H01L 41/042; G02B 26/00; G02B 7/04; G02B 7/09; G02B 27/64
See application file for complete search history.

(56) References Cited

U.S. PATENT DOCUMENTS

| | | | | |
|---|---|---|---|---|
| 4,628,907 | A * | 12/1986 | Epley | H04R 25/606 381/322 |
| 9,828,296 | B2 * | 11/2017 | Yamazaki | C04B 35/62685 |
| 11,350,187 | B2 * | 5/2022 | Phillips | H04Q 9/00 |
| 11,396,928 | B2 * | 7/2022 | Tesar | F16H 1/46 |
| 11,425,487 | B2 * | 8/2022 | Kim | G10L 15/22 |
| 2012/0146462 | A1 * | 6/2012 | Yamazaki | C04B 35/462 252/62.9 PZ |
| 2014/0139070 | A1 * | 5/2014 | Yamazaki | G01L 23/222 252/62.9 PZ |
| 2020/0080621 | A1 * | 3/2020 | Tesar | A61B 34/30 |
| 2020/0366975 | A1 * | 11/2020 | Phillips | H04B 1/38 |
| 2021/0168492 | A1 * | 6/2021 | Kim | H04R 1/1091 |

* cited by examiner

*Primary Examiner* — Olga V Merkoulova
(74) *Attorney, Agent, or Firm* — Muncy, Geissler, Olds & Lowe (57) ABSTRACT

A tactile feedback mechanism is provided, including a movable part, a fixed part, and a driving assembly. The movable part includes a first weight element. The movable part is movable relative to the fixed part. The driving assembly is used for driving the movable part to move relative to the fixed part. The first weight element is made of a metal material.

19 Claims, 6 Drawing Sheets

TACTILE FEEDBACK MECHANISM

CROSS REFERENCE TO RELATED APPLICATIONS

This application claims the benefit of U.S. Provisional Application No. 63/127,746, filed 18 Dec. 2020, the entirety of which is incorporated by reference herein.

BACKGROUND OF THE INVENTION

Field of the Invention

The present disclosure relates to a tactile feedback mechanism, and more particularly to a tactile feedback mechanism of an electrical device.

Description of the Related Art

With the development of technology, many electronic devices (such as tablet computers or smartphones) now have tactile feedback functionality. Through the tactile feedback mechanism provided on the electronic device, the electronic device may generate vibration so that the user feels the tactile feedback when the user touches the electronic device. For example, when the user presses the button or the screen of the electronic device, the tactile feedback mechanism may provide tactile feedback.

With the development of technology, the demand for miniaturization of electronic devices has become more and more common. Therefore, there is a need for a tactile feedback mechanism that is miniaturized and may provide good vibration feedback.

BRIEF SUMMARY OF THE INVENTION

To solve the problems of the prior art, a tactile feedback mechanism is provided, including a movable part, a fixed part, and a driving assembly. The movable part includes a first weight element. The movable part is movable relative to the fixed part. The driving assembly is used for driving the movable part to move relative to the fixed part. The first weight element is made of a metal material.

In one of the embodiments of the present disclosure, the tactile feedback mechanism further includes a connecting element. The driving assembly includes a first piezoelectric element having piezoelectric material. The first piezoelectric element is disposed on the movable part. The first piezoelectric element is movable relative to the fixed part. No part of the first piezoelectric element is fixedly connected to the fixed part. The first piezoelectric element is at least partially fixedly connected to the first weight element. The first piezoelectric element is connected to the first weight element via the connecting element. The connecting element is glue or a solder material.

In one of the embodiments of the present disclosure, the first piezoelectric element penetrates the first weight element.

In one of the embodiments of the present disclosure, the tactile feedback mechanism further includes a first elastic element. The movable part is movably connected to the fixed part via the first elastic element. The first elastic element has a plate-like structure. The driving assembly is electrically connected to an external circuit via the first elastic element. The first piezoelectric element is movably connected to the fixed part via the first elastic element.

In one of the embodiments of the present disclosure, the first elastic element includes a first movable part connecting end, and a first fixed part connecting end. The first movable part connecting end is fixedly connected to the movable part. The first fixed part connecting end is fixedly connected to a first surface of the fixed part. The fixed part includes a first cover and a first frame. The first surface forms a first accommodating space corresponding to the movable part. When the movable part is located in a first extreme position relative to the fixed part, the movable part is at least partially located in the first accommodating space. When the movable part is located in the first extreme position, the first elastic element is at least partially located in the first accommodating space. A second surface of the first accommodating space faces the movable part. The driving assembly is used for driving the movable part to move within a range of movement relative to the fixed part. When the movable part is located in an arbitrary position in the range of motion, the first movable part connecting end and the first movable part are not in contact with the first surface. The first cover is fixedly connected to the first frame. The first surface is located on the first frame, and the second surface is located on the first cover. The driving assembly is used for driving the movable part to move along a first axis relative to the fixed part. The first elastic element at least partially overlaps the first surface when viewed along the first axis. The first surface is parallel to the first axis.

In one of the embodiments of the present disclosure, the tactile feedback mechanism further includes a second elastic element. The second elastic element further includes a second movable part connecting end, and a second fixed part connecting end. The second movable part connecting end is fixedly connected to the movable part. The second fixed part connecting end is fixedly connected to a third surface of the fixed part. The fixed part includes a second cover and a second frame. The movable part is movably connected to the fixed part via the second elastic element. The second elastic element has a plate-like structure. The driving assembly is electrically connected to an external circuit via the second elastic element. The third surface forms a second accommodating space corresponding to the movable part. When the movable part is located in a second extreme position relative to the fixed part, the movable part is at least partially located in the second accommodating space. When the movable part is located in the second extreme position, the second elastic element is at least partially located in the second accommodating space. A fourth surface of the second accommodating space faces the movable part. When the movable part is located in an arbitrary position in the range of movement, the movable part and the second elastic element are not in contact with the fourth surface. The second cover is fixedly connected to the second frame. The third surface is located on the second frame, and the fourth surface is located on the second cover. The second elastic element at least partially overlaps the third surface when viewed along the first axis. The third surface is parallel to the first axis.

In a one of the embodiments of the present disclosure, in the first axis, the maximum size of the first accommodating space is different from the maximum size of the second accommodating space. In the first axis, the maximum distance between the first surface and the second surface is different from the maximum distance between the third surface and the fourth surface.

In one of the embodiments of the present disclosure, the elastic coefficient of the first elastic element is smaller than the elastic coefficient of the second elastic element. In a the first axis, the maximum size of the first accommodating space is greater than the maximum size of the second accommodating space. In the first axis, the maximum distance between the first surface and the second surface is greater than the maximum distance between the third surface and the fourth surface.

In one of the embodiments of the present disclosure, a current of the external circuit flows from the first elastic element to the first piezoelectric element, and the current flows out from the second elastic element.

In one of the embodiments of the present disclosure, the driving assembly further includes a second piezoelectric element. A connecting surface of the first piezoelectric element is connected to the first surface of the first weight element, and a connecting surface of the second piezoelectric element is connected to the second surface of the first weight element.

In one of the embodiments of the present disclosure, a first current of the external circuit flows from the first elastic element to the first piezoelectric element, and the first current flows out from the connecting surface of the first piezoelectric element. A second current of the external circuit flows to the second piezoelectric element from the second elastic element, and the second current flows out from the connecting surface of the second piezoelectric element.

In one of the embodiments of the present disclosure, the elastic coefficient of the first elastic element and the elastic coefficient of the second elastic element are different.

In one of the embodiments of the present disclosure, the elastic coefficient of the first elastic element and the elastic coefficient of the second elastic element are the same.

In one of the embodiments of the present disclosure, the movable part further includes a second weight element, and the first piezoelectric element penetrates the first weight element and the second weight element.

In one of the embodiments of the present disclosure, the first weight element is not in contact with the second weight element.

In one of the embodiments of the present disclosure, a current of the external circuit flows from the first elastic element to the first piezoelectric element, and the current flows out from the second elastic element.

In one of the embodiments of the present disclosure, the mass of the first weight element and the mass of the second weight element are different, and the elastic coefficient of the first elastic element and the elastic coefficient of the second elastic element are the same.

In one of the embodiments of the present disclosure, the mass of the first weight element and the mass of the second weight element are different, and the elastic coefficient of the first elastic element and the elastic coefficient of the second elastic element are different.

In one of the embodiments of the present disclosure, the mass of the first weight element and the mass of the second weight element are the same, and the elastic coefficient of the first elastic element and the elastic coefficient of the second elastic element are different.

In one of the embodiments of the present disclosure, the first accommodating space and the second accommodating space are different sizes.

BRIEF DESCRIPTION OF THE DRAWINGS

In order to make the above and other objectives, features, and advantages of the present disclosure more obvious and understandable, preferred embodiments are listed below in conjunction with the accompanying drawings, which are described in detail as follows.

DETAILED DESCRIPTION OF THE INVENTION

The making and using of tactile feedback mechanisms of embodiments of the present disclosure are discussed in detail below. It should be appreciated, however, that the embodiments provide many applicable inventive concepts that may be embodied in a wide variety of specific contexts. The specific embodiments discussed are merely illustrative of specific ways to make and use the embodiments and do not limit the scope of the present disclosure.

It should be understood That is, although the terms "first", "second" etc. may be used herein to describe various elements, layers and/or portions, and these elements, layers, and/or portions should not be limited by these terms. These terms are only used to distinguish one element, layer, or portion. Thus, a first element, layer or portion discussed below could be termed a second element, layer or portion without departing from the teachings of some embodiments of the present disclosure. In addition, for the sake of brevity, terms such as "first" and "second" may not be used in the description to distinguish different elements. As long as it does not depart from the scope defined by the appended claims, the first element and/or the second element described in the appended claims may be interpreted as any element that meets the description in the specification.

Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
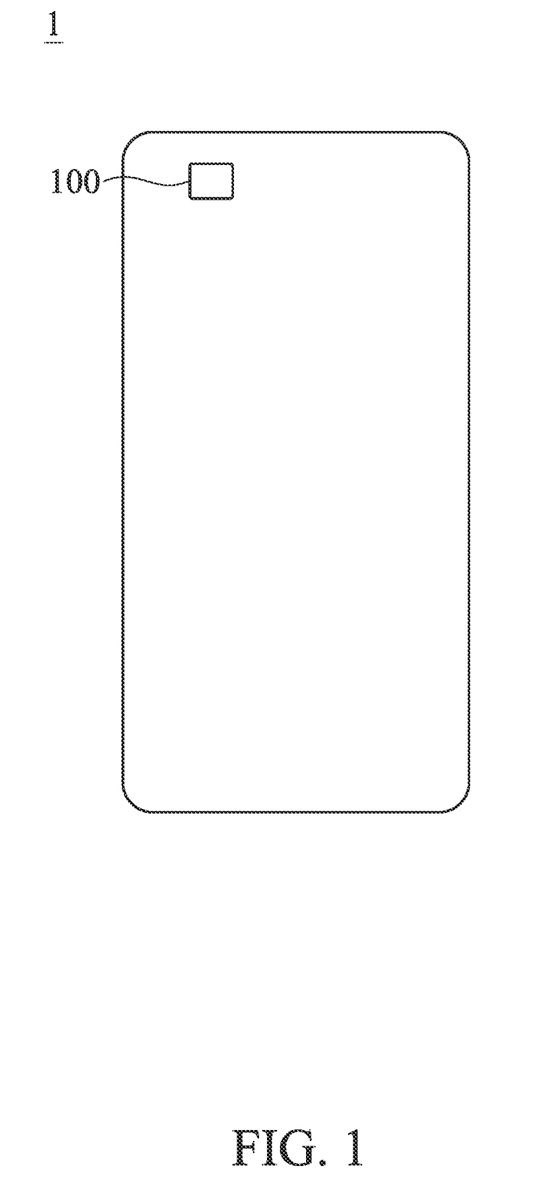
FIG. 1 is a schematic view of an electrical device according to some embodiment of the present disclosure.

Firstly, please refer to FIG. 1, FIG. 1 is a schematic view of an electrical device 1 according to some embodiment of the present disclosure. As shown in FIG. 1, a tactile feedback mechanism 100 of some embodiment of the present disclosure may be mounted in an electrical device 1 for generating vibration, wherein the aforementioned electrical device 1 may, for example, be a touch device, but the present disclosure is not limited to these. It should be noted that the position and size of the tactile feedback mechanism 100 and of the electrical device 1 shown in FIG. 1 are only exemplary, and are not for limiting the position or size of the tactile feedback mechanism 100 and the electrical device 1.

In fact, according to different needs, the tactile feedback mechanism 100 may be mounted in different positions in the electrical device 1.

Figure 2:
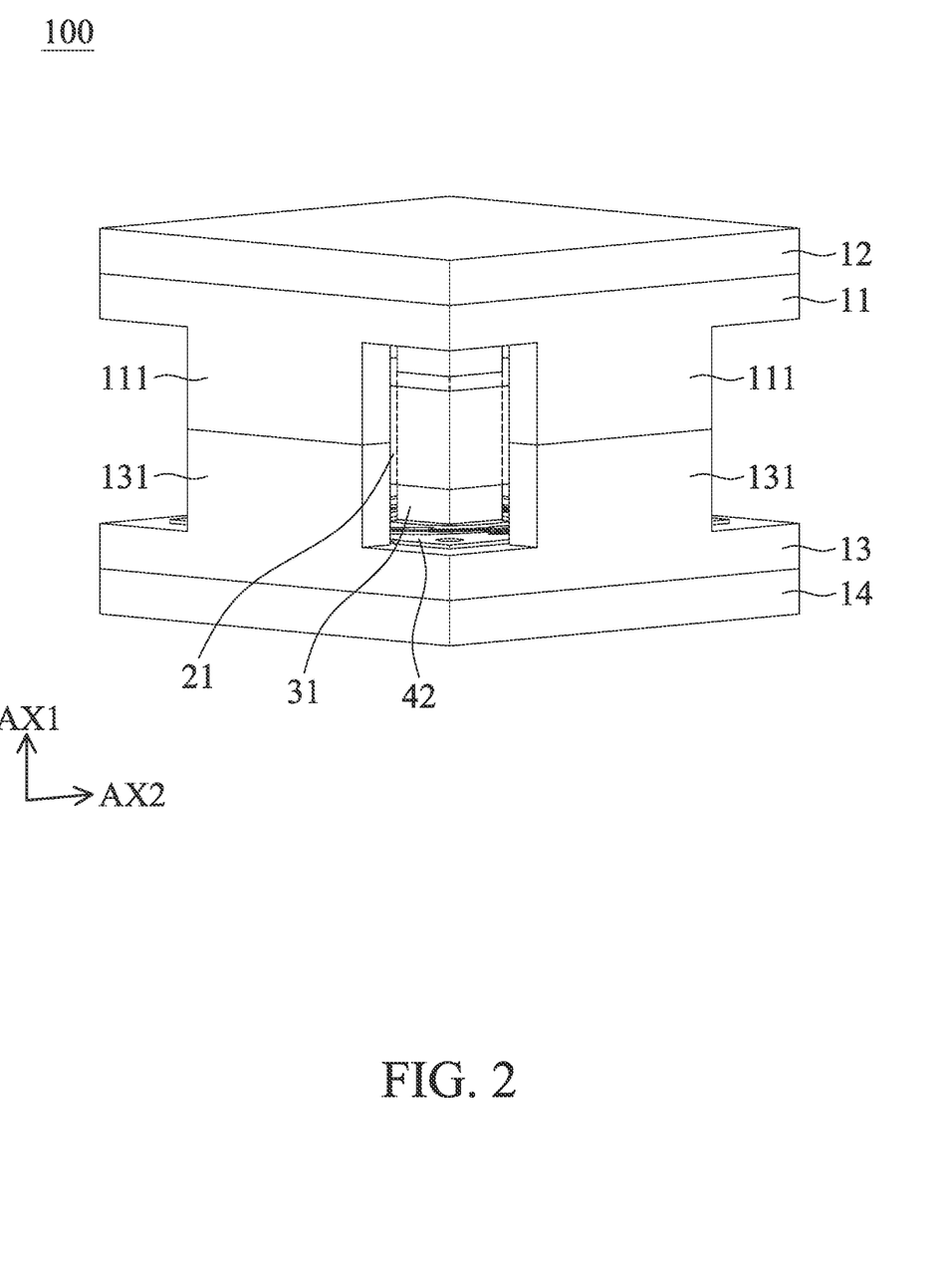
FIG. 2 is a schematic view of the tactile feedback mechanism according to some embodiments of the present disclosure.
Figure 3:
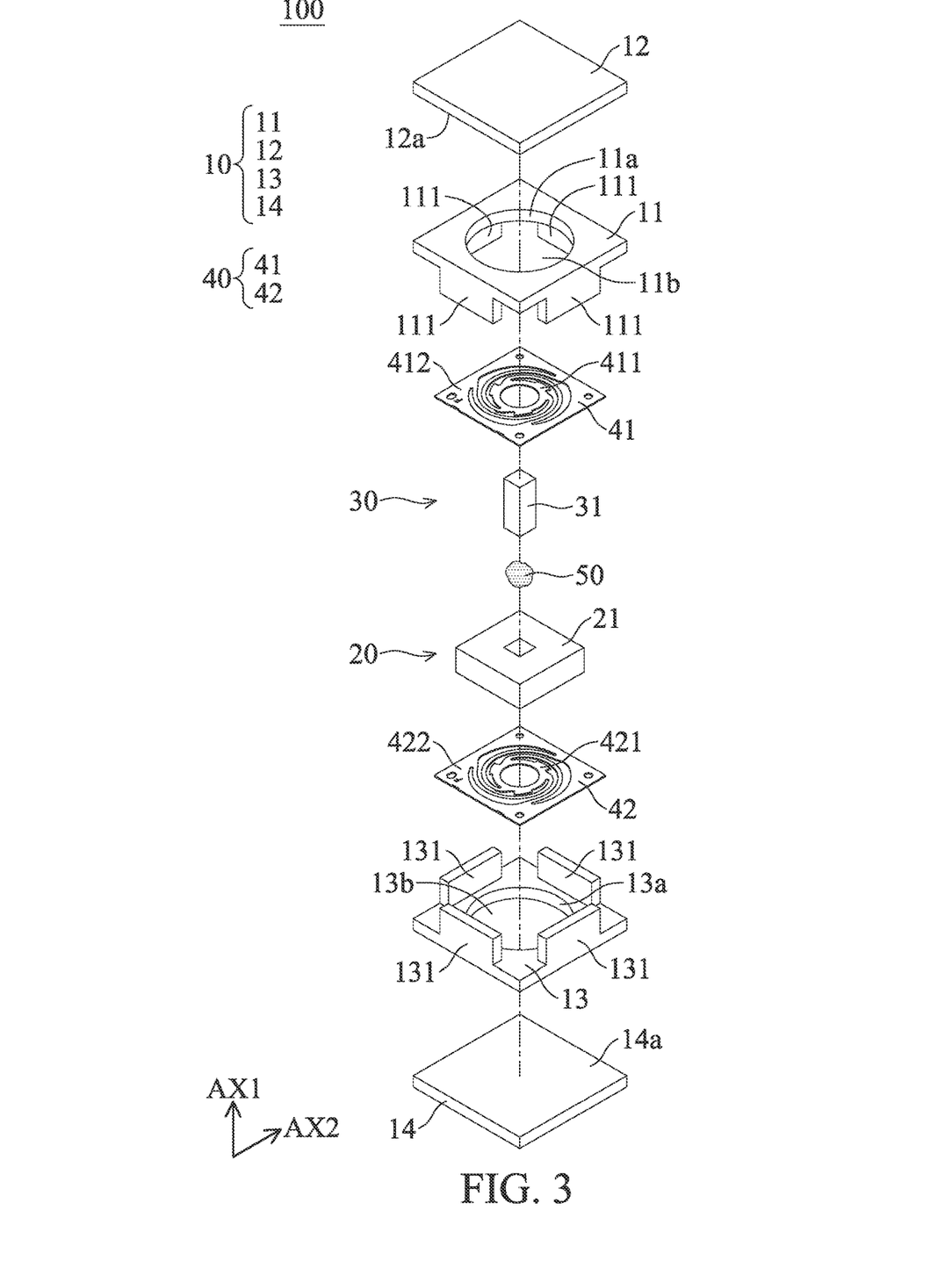
FIG. 3 is an exploded view of the tactile feedback mechanism according to some embodiments of the present disclosure.

Please refer to FIG. 2 and FIG. 3. FIG. 2 is a schematic view of the tactile feedback mechanism 100 according to some embodiments of the present disclosure; and FIG. 3 is an exploded view of the tactile feedback mechanism 100 according to some embodiments of the present disclosure. As shown in FIG. 2 and FIG. 3, the tactile feedback mechanism 100 may include a fixed part 10, a movable part 20, a driving assembly 30, an elastic assembly 40, and a connecting element 50.

The fixed part 10 may include a first frame 11, a first cover 12, a second frame 13, and a second cover 14. The movable part 20 may include a first weight element 21. The driving assembly 30 may include a first piezoelectric element 31. The elastic assembly 40 may include a first elastic element 41 and a second elastic element 42. According to some embodiments of the present disclosure, the driving assembly 30 may drive the movable part 20 to move along a first axis AX1 relative to the fixed part 10.

Please refer to FIG. 2, according to some embodiments of the present disclosure, the first frame 11 may include four first frame walls 111, and the second frame 13 may include four second frame walls 131. The first frame wall 111 may extend toward the second frame 13, and the second frame wall 131 may extend toward the first frame 11. The first frame wall 111 and the second frame wall 131 may be in contact with each other and be fixedly connected to each other. In this way, the movable part 20 may be prevented from being impacted by external elements.

As shown in FIG. 2, the first frame 11 has a first surface 11a. The first surface 11a may form a first accommodating space 11b. The first cover 12 is provided on the first frame 11. The first cover 12 may be fixedly connected to the first frame 11, and the first cover 12 may have a second surface 12a. According to some embodiments of the present disclosure, the first surface 11a is located on the first frame 11, and the first surface 11a may be presented in a ring shape, and the first surface 11a may be parallel to the first axis AX1. According to sonic embodiments of the present disclosure, the second surface 12a is located on the first cover 12, and the second surface 12a faces the movable part 20.

According to some embodiments of the present disclosure, the first cover 12 may cover the first accommodating space 11b, so that the first accommodating space 11b becomes a semi-closed space. In other words, the first accommodating space 11b may be formed by the first surface 11a and the second surface 12a.

Moreover, the first accommodating space 11b may correspond to the movable part 20. That is, according to some embodiments of the present disclosure, the first accommodating space 11b and the movable part 20 at least partially overlap when viewed along the first axis AX1.

Please continue to refer to FIG. 2, according to some embodiments of the present disclosure, the first accommodating space 11b is opened toward the movable part 20, such that the movable part 20 is at least partially located in the first accommodating space 11b when the movable part 20 is located in a first extreme position (not shown) relative to the fixed part 10.

It should be noted that the first extreme position refers to the position where the movable part 20 is closest to the first cover 12 after the movable part 20 moves along the first axis AX1. That is, according to some embodiments of the present disclosure, when the moving part 20 is in the first extreme position, the movable part 20 and the first surface 11a of the first frame 11 at least partially overlap when viewed along a second axis AX2 that is perpendicular to the first axis AX1.

The abovementioned configuration may increase the range of movement of the movable part 20, so as to increase the vibration feedback of the tactile feedback mechanism 100. Moreover, the abovementioned configuration may also reduce the size of the tactile feedback mechanism 100, thereby achieving the effect of miniaturization.

As shown in FIG. 2, the second frame 13 has a third surface 13a. The third surface 13a may form a second accommodating space 13b. The second cover 14 is disposed on the second frame 13. The second cover 14 may be fixedly connected to the second frame 13, and the second cover 14 may have a fourth surface 14a. According to some embodiments of the present disclosure, the third surface 13a is located on the second frame body 13, the third surface 13a may be presented in a ring shape, and the third surface 13a is parallel to the first axis AX1. According to some embodiments of the present disclosure, the fourth surface 14a is located on the second cover 14, and the fourth surface 14a faces the movable part 20.

According to some embodiments of the present disclosure, the second cover 14 may cover the second accommodating space 13b, such that the second accommodating space 13b becomes a semi-closed space. In other words, the second accommodating space 13b may be formed by the third surface 13a and the fourth surface 14a.

Also, the second accommodating space 13b may correspond to the movable part 20. That is, according to some embodiments of the present disclosure, the second accommodating space 13b and the movable part 20 at least partially overlap when viewed along the first axis AX1.

Please continue to refer to FIG. 2, according to some embodiments of the present disclosure, the second accommodating space 13b is opened toward the movable part 20, such that the movable part 20 is at least partly located in the second accommodating space 13b when the movable part 20 is located in a second extreme position (not shown) relative to the fixed part 10.

It should be noted that the second extreme position refers to the position where the movable part 20 is closest to the second cover 14 after the movable part 20 moves along the first axis AX1. That is, according to some embodiments of the present disclosure, when the movable part 20 is located in the second extreme position, the movable part 20 and the third surface 13a of the second frame 13 at least partially overlap when viewed along the second axis AX2.

The abovementioned configuration may increase the range of movement of the movable part 20, so as to increase the vibration feedback of the tactile feedback mechanism 100, thereby achieving the effect of enhancing the vibration. Moreover, the abovementioned configuration may also reduce the size of the tactile feedback mechanism 100, thereby achieving the effect of miniaturization.

Please refer to FIG. 2, according to some embodiments of the present disclosure, the first piezoelectric element 31 is disposed on the movable part 20. According to some embodiments of the present disclosure, the first weight element 21 of the movable part 20 may be at least fixedly connected to the first piezoelectric element 31 via the connecting element 50. It should be noted that the first weight element may be made of a metal material, and the connecting element 50 may be glue or solder materials.

According to some embodiments of the present disclosure, in the first axis AX1, the maximum size of the first accommodating space 11b and the maximum size of the second accommodating space 13b may be the same, so that the tactile feedback mechanism 100 has uniform vibration feedback.

It should be noted that, according to some embodiments of the present disclosure, the maximum dimension of the first accommodating space 11b may be regarded as the width of the first surface 11a along the first axis AX1; and the maximum dimension of the second accommodating space 13b may be regarded as the width of the third surface 13a along the first axis AX1.

The abovementioned configuration may make the mass distribution of the tactile feedback mechanism 100 more uniform, and thus may achieve the effect of improving the stability and reliability of the tactile feedback mechanism 100.

According to some embodiments of the present disclosure, in the first axis AX1, the maximum size of the first accommodating space 11b is different from the maximum size of the second accommodating space 13b.

According to some embodiments of the present disclosure, in the first axis AX1, the maximum size of the first accommodating space 11b is smaller than the maximum size of the second accommodating space 13b. The abovementioned configuration may increase the range of upward movement of the tactile feedback mechanism 100, so that the tactile feedback mechanism 100 may have a different vibration feedback, thereby the user may feel various vibrations.

According to some embodiments of the present disclosure, in the first axis AX1, the maximum size of the first accommodating space 11b is greater than the maximum size of the second accommodating space 13b. The aforementioned configuration may increase the range of downward movement of the tactile feedback mechanism 100 to increase, so that the tactile feedback mechanism 100 may have a different vibration feedback, thereby the user may feel various vibrations. Moreover, it may also effectively prevent the movable part 20 from contacting the second cover 14 to avoid damage.

As described above, according to some embodiments of the present disclosure, in the first axis AX1, the maximum distance between the first surface 11a of the first frame 11 and the second surface 12a of the first cover member 12 is different from the maximum distance between the third surface 13a of the second frame 13 and the fourth surface 14a of the second cover 14. It should be noted that, according to some embodiments of the present disclosure, the maximum distance between the first surface 11a and the second surface 12a may refer to the maximum distance from the lower edge of the first surface 11a to the second surface 12a when viewed along the first axis AX1; and the maximum distance between the third surface 13a and the fourth surface 14a may refer to the maximum distance from the lower edge of the third surface 13a to the fourth surface 14a when viewed along the first axis AX1.

As described above, according to some embodiments of the present disclosure, in the first axis AX1, the maximum distance between the first surface 11a of the first frame 11 and the second surface 12a of the first cover member 12 is longer than the maximum distance between and the third surface 13a of the second frame 13 and the fourth surface 14a of the second cover 14.

According to some embodiments of the present disclosure, the first piezoelectric element 31 may penetrate the first weight element 21. As shown in FIG. 2, the dashed line shown in the first weight element 21 represents the portion of the first piezoelectric element 31 that penetrates the first weight element 21. It should be noted that the dashed line shown here is only for ease of description and observation. In fact, according to some embodiments of the present disclosure, the dashed line shown here may not be visible by naked eyes. The first piezoelectric element 31 has a piezoelectric material, so that the first piezoelectric element 31 may move relative to the fixed part 10 when the first piezoelectric element 31 receives an external current. According to some embodiments of the present disclosure, no part of the first piezoelectric element 31 is fixedly connected to the fixed part 10.

The driving assembly 30 may drive the movable part 20 to move within a movement range (not shown) relative to the fixed part 10. According to some embodiments of the present disclosure, the movable part 20 may move beyond the aforementioned range of movement only when the tactile feedback mechanism 100 is impacted.

As shown in FIG. 3, the first elastic element 41 has a plate-like structure. According to some embodiments of the present disclosure, the movable part 20 may be movably connected to the fixed part 10 via the first elastic element 41, and the first piezoelectric element 31 may be movably connected to the fixed part 10 via the first elastic element 41. Moreover, according to some embodiments of the present disclosure, the driving assembly 30 may be electrically connected to an external circuit via the first elastic element 41.

The first elastic element 41 may include a first movable part connecting end 411 and a first fixed part connecting end 412. The first movable part connecting end 411 may be located on the central portion of the first elastic element 41, and the first fixed part connecting end 412 may be located on the outer edge portion of the first elastic element 41.

According to some embodiments of the present disclosure, the first movable part connecting end 411 is fixedly connected to the movable part 20, and the first fixed part connecting end 412 is fixedly connected to the first surface 11a of the first frame 11. According to some embodiments of the present disclosure, the first elastic element 41 at least partially overlaps the first surface 11a of the first frame 11 when viewed along the first axis AX1.

As shown in FIG. 3, the second elastic element 42 has a plate-like structure. According to some embodiments of the present disclosure, the movable part 20 may be movably connected to the fixed part 10 via the second elastic element 42, and the first piezoelectric element 31 may be movably connected to the fixed part 10 via the second elastic element 42. Moreover, according to some embodiments of the present disclosure, the driving assembly 30 may be electrically connected to an external circuit via the second elastic element 42.

The second elastic element 42 may include a second movable part connecting end 421 and a second fixed part connecting end 422. The second movable part connecting end 421 may be located on the central portion of the second elastic element 42, and the second fixed part connecting end 422 may be located on the outer edge portion of the second elastic element 42. According to some embodiments of the present disclosure, the second movable part connecting end 421 is fixedly connected to the movable part 20, and the second fixed part connecting end 422 is fixedly connected to the third surface 13a of the second frame body 13. According to some embodiments of the present disclosure, the second elastic element 42 at least partially overlaps the third surface 13a of the second frame 13 when viewed along the first axis AX1.

According to some embodiments of the present disclosure, the elastic coefficient of the first elastic element 41 may be the same as the elastic coefficient of the second elastic element 42 so that the tactile feedback mechanism 100 has uniform vibration feedback.

According to some embodiments of the present disclosure, the elastic coefficient of the first elastic element 41 may be different from the elastic coefficient of the second elastic element 42. According to some embodiments of the present disclosure, the elastic coefficient of the first elastic element 41 may be smaller than the elastic coefficient of the second elastic element 42. According to some embodiments of the present disclosure, the elastic coefficient of the first elastic element 41 may be greater than the elastic coefficient of the second elastic element 42. The aforementioned configuration may enable the tactile feedback mechanism 100 to have various vibration feedbacks, thereby allowing the user o feel various vibrations.

According to some embodiments of the present disclosure, when the movable part 20 is located in an arbitrary position in the range of movement, the movable part 20 and the first movable part connecting end 411 of the first elastic element 41 are not in contact with the first surface 11a of the first frame 11. According to some embodiments of the present disclosure, when the movable part 20 is located in an arbitrary position in the aforementioned movement range, the movable part 20 and the second elastic element 42 are not in contact with the fourth surface 14a of the second cover 14.

According to some embodiments of the present disclosure, a current of an external circuit may flow from the first elastic element 41 to the first piezoelectric element 31, and this current may flow out from the second elastic element 41.

Figure 4:
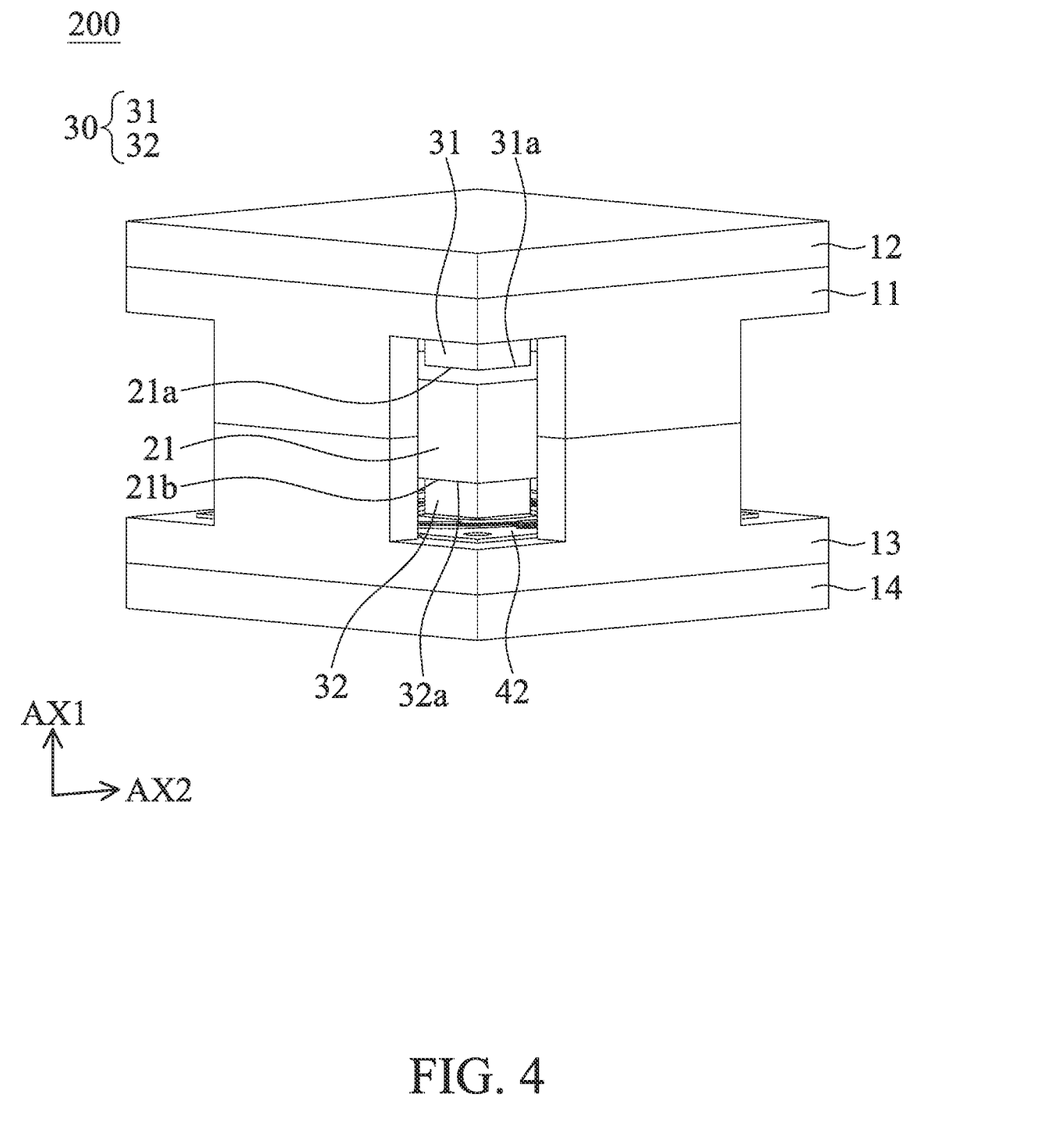
FIG. 4 is a schematic view of the tactile feedback mechanism according to some embodiments of the present disclosure.

Please refer to FIG. 4, FIG. 4 is a schematic view of the tactile feedback mechanism 200 according to some embodiments of the present disclosure. The structure and configuration of the tactile feedback mechanism 200 is similar to the structure and configuration of the tactile feedback mechanism 100, and the similar parts are not repeated herein.

The main difference between the tactile feedback mechanism 200 and the tactile feedback mechanism 100 is that the driving assembly 30 of the tactile feedback mechanism 200 may further include a second piezoelectric element 32, and the first piezoelectric element 31 of the driving assembly 30 of the tactile feedback mechanism 200 does not penetrate the first weight element 21.

Please refer to FIG. 4, according to some embodiments of the present disclosure, the first piezoelectric element 31 may include a connecting surface 31a, and the second piezoelectric element 32 may include a connecting surface 32a.

The first piezoelectric element 31 is disposed on the movable part 20, and the second piezoelectric element 32 is disposed below the movable part 20. The first weight element 21 may include a first surface 21a and a second surface 21b. The first surface 21a of the first weight element 21 may face the connecting surface 31a of the first piezoelectric element 31, and the second surface 21b of the first weight element 21 may face the connecting surface 32a of the second piezoelectric element 32.

The first weight element 21 of the movable part 20 is at least fixedly connected to the first piezoelectric element 31 and the second piezoelectric element 32. According to some embodiments of the present disclosure, the connecting surface 31a of the first piezoelectric element 31 is connected to the first surface 21a of the first weight element 21, and the connecting surface 32a of the second piezoelectric element 32 is connected to the second surface 21b of the first weight element 21.

The first piezoelectric element 31, the first weight element 21, and the second piezoelectric element 32 may be arranged along the first axis AX1, and the first weight element 21 may be located between the first piezoelectric element 31 and the second piezoelectric element 32.

According to some embodiments of the present disclosure, the first elastic element 41 of the first movable part connecting end 411 is fixedly connected to the movable part 20, and the first fixed part connecting end 412 of the first elastic element 41 is fixedly connected to the first surface 11a of the first frame 11. According to some embodiments of the present disclosure, the first elastic element 41 at least partially overlaps the first surface 11a of the first frame 11 when viewed along the first axis AX1.

According to some embodiments of the present disclosure, the second movable part connecting end 421 of the second elastic element 42 is fixedly connected to the movable part 20, and second fixed part connecting end 422 of the second elastic element 42 is fixedly connected to the third surface 13a of the second frame 13. According to some embodiments of the present disclosure, the second elastic element 42 at least partially overlaps the third surface 13a of the second frame 13 when viewed along the first axis AX1.

According to some embodiments of the present disclosure, the movable part 20 may be movably connected to the fixed part 10 via the first elastic element 41, and the first piezoelectric element 31 may be movably connected to the fixed part 10 via the first elastic element 41. According to some embodiments of the present disclosure, the movable part 20 may be movably connected to the fixed part 10 via the second elastic element 42, and the first piezoelectric element 31 may be movably connected to the fixed part 10 via the second elastic element 42. Moreover, the driving assembly 30 may be electrically connected to an external circuit via the first elastic element 41 and the second elastic element 42.

According to some embodiments of the present disclosure, a first current of an external circuit may flow from the first elastic element 41 into the first piezoelectric element 31, and the first current may flow out from the connecting surface 31a of the first piezoelectric element 31. According to some embodiments of the present disclosure, a second current of the external circuits may flow from the second elastic element 42 into the second piezoelectric element 32, and the second current may flow out from the connecting surface 32a of the second piezoelectric element 32.

According to some embodiments of the present disclosure, the first piezoelectric element 31 and the second piezoelectric element 32 have piezoelectric materials, so that when the first piezoelectric element 31 and the second piezoelectric element 32 receive the first current and the second current, they may move relative to the fixed part 10.

According to some embodiments of the present disclosure, the driving assembly 30 may drive the movable part 20 to move relative to the fixed part 10 within a range of movement (not shown). According to some embodiments of the present disclosure, the movable part 20 may move beyond the aforementioned range of motion only when the tactile feedback mechanism 200 is impacted.

According to some embodiments of the present disclosure, the elastic coefficient of the first elastic element 41 may be the same as the elastic coefficient of the second elastic element 42, such that the tactile feedback mechanism 200 has uniform vibration feedback.

According to some embodiments of the present disclosure, the elastic coefficient of the first elastic element 41 may be different from the elastic coefficient of the second elastic element 42. According to some embodiments of the present disclosure, the elastic coefficient of the first elastic element 41 may be smaller than the elastic coefficient of the second elastic element 42. According to some embodiments of the present disclosure, the elastic coefficient of the first elastic element 41 may be greater than the elastic coefficient of the second elastic element 42. The aforementioned configuration may enable the tactile feedback mechanism 200 to have various vibration feedbacks, thereby allowing the user o feel various vibrations.

According to some embodiments of the present disclosure, in the first axis AX1, the maximum size of the first accommodating space 11b and the maximum size of the second accommodating space 13b may be the same, so that the tactile feedback mechanism 200 has uniform vibration feedback.

The aforementioned configuration may make the mass distribution of the tactile feedback mechanism 200 more uniform, and thus may achieve the effect of improving the stability and reliability of the tactile feedback mechanism 200.

According to some embodiments of the present disclosure, in the first axis AX1, the maximum size of the first accommodating space 11b is different from the maximum size of the second accommodating space 13b.

According to some embodiments of the present disclosure, in the first axis AX1, the maximum size of the first accommodating space 11b is smaller than the maximum size of the second accommodating space 13b. The aforementioned configuration may increase the range of upward movement of the tactile feedback mechanism 200, so that the tactile feedback mechanism 200 may have various vibration feedbacks, thereby allowing the user to feel various vibrations.

According to some embodiments of the present disclosure, in the first axis AX1, the maximum size of the first accommodating space 11b is greater than the maximum size of the second accommodating space 13b. The aforementioned configuration may increase the range of downward movement of the tactile feedback mechanism 200, so that the tactile feedback mechanism 200 may have various vibration feedbacks, thereby allowing the user to feel various vibrations. Moreover, it may also effectively prevent the movable part 20 from contacting the second cover 14 to avoid damage.

Furthermore, since the tactile feedback mechanism 200 has a different configuration from the tactile feedback mechanism 100, the tactile feedback mechanism 200 may generate different feedback from the tactile feedback mechanism 100. For example, according to some embodiments of the present disclosure, the tactile feedback mechanism 200 has different vibration modes and vibration intensities.

Figure 5:
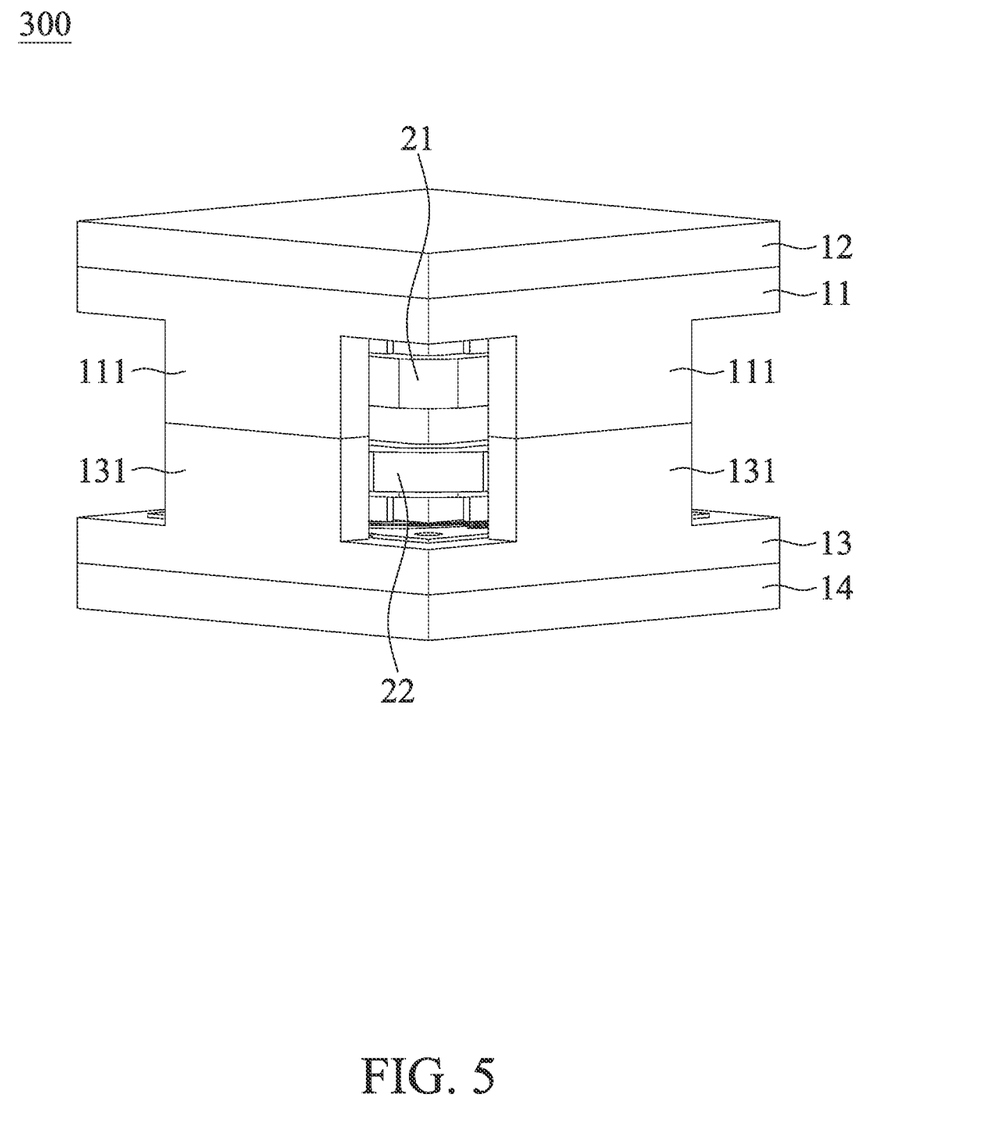
FIG. 5 is a schematic view of a tactile feedback mechanism according to some embodiments of the present disclosure.
Figure 6:
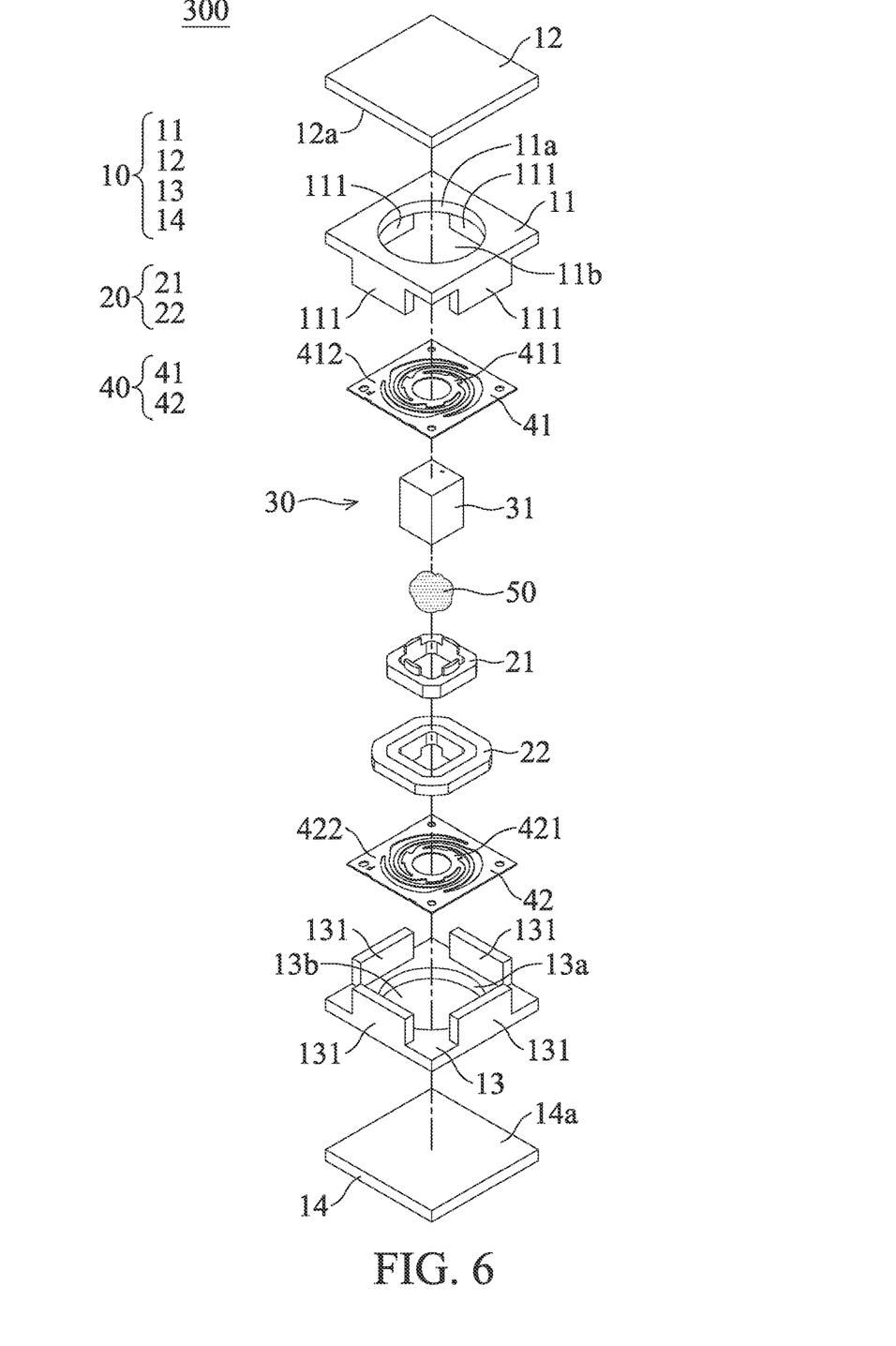
FIG. 6 is an exploded view of the tactile feedback mechanism according to some embodiments of the present disclosure.

Please refer to FIG. 5 and FIG. 6. FIG. 5 is a schematic view of a tactile feedback mechanism 300 according to some embodiments of the present disclosure. FIG. 6 is an exploded view of the tactile feedback mechanism 300 according to some embodiments of the present disclosure. The structure and configuration of the tactile feedback mechanism 300 are similar to that of the tactile feedback mechanism 100, and the similar parts are not repeated herein.

The main difference between the tactile feedback mechanism 300 and the tactile feedback mechanism 100 is that the movable part 20 of the tactile feedback mechanism 300 may further include a second weight element 22, and the first piezoelectric element 31 penetrates the first weight element 21 and the second weight element 22, and the first weight element 21 is not in contact with the second weight element 22.

According to some embodiments of the present disclosure, the mass of the first weight element 21 and the mass of the second weight element 22 may be the same, so that the tactile feedback mechanism 300 has uniform vibration feedback.

According to some embodiments of the present disclosure, the mass of the first weight element 21 and the mass of the second weight element 22 may be different.

According to some embodiments of the present disclosure, the mass of the first weight element 21 may be greater than the mass of the second weight element 22. In this way, the tactile feedback mechanism 300 may have various vibration feedbacks, thereby allowing the user to feel various vibrations.

According to some embodiments of the present disclosure, the mass of the first weight element 21 may be less than the mass of the second weight element 22. In this way, the tactile feedback mechanism 300 may have various vibration feedbacks, thereby allowing the user to feel various vibrations.

According to some embodiments of the present disclosure, the elastic coefficient of the first elastic element 41 may be the same as the elastic coefficient of the second elastic element 42 so that the tactile feedback mechanism 300 has uniform vibration feedback.

According to some embodiments of the present disclosure, the elastic coefficient of the first elastic element 41 may be different from the elastic coefficient of the second elastic element 42. According to some embodiments of the present disclosure, the elastic coefficient of the first elastic element 41 may be smaller than the elastic coefficient of the second elastic element 42. According to some embodiments of the present disclosure, the elastic coefficient of the first elastic element 41 may be greater than the elastic coefficient of the second elastic element 42. The aforementioned configuration may enable the tactile feedback mechanism 300 to have various vibration feedbacks, thereby allowing the user to feel various vibrations.

According to some embodiments of the present disclosure, in the first axis AX1, the maximum size of the first accommodating space 11b and the maximum size of the second accommodating space 13b may be the same, so that the tactile feedback mechanism 300 has uniform vibration feedback.

The aforementioned configuration may make the mass distribution of the tactile feedback mechanism 300 more uniform, and thus may achieve the effect of improving the stability and reliability of the tactile feedback mechanism 300.

According to some embodiments of the present disclosure, in the first axis AX1, the maximum size of the first accommodating space 11b is different from the maximum size of the second accommodating space 13b.

According to some embodiments of the present disclosure, in the first axis AX1, the maximum size of the first accommodating space 11b is smaller than the maximum size of the second accommodating space 13b. The aforementioned configuration may increase the range of upward movement of the tactile feedback mechanism 300, so that the tactile feedback mechanism 300 may have various vibration feedbacks, thereby allowing the user to feel various vibrations.

According to some embodiments of the present disclosure, in the first axis AX1, the maximum size of the first accommodating space 11b is greater than the maximum size of the second accommodating space 13b. The aforementioned configuration may increase the range of downward movement of the tactile feedback mechanism 300, so that the tactile feedback mechanism 300 may have various vibration feedbacks, thereby allowing the user to feel various vibrations. Moreover, it may also effectively prevent the movable part 20 from contacting the second cover 14 to avoid damage.

Furthermore, since the tactile feedback mechanism 300 has a different configuration from the tactile feedback mechanism 100 and the tactile feedback mechanism 200, the tactile feedback mechanism 300 may generate different feedback from the tactile feedback mechanism 100 and the tactile feedback mechanism 200. For example, according to some embodiments of the present disclosure, the tactile feedback mechanism 300 has different vibration modes and vibration intensities.

In conclusion, the tactile feedback mechanism of the embodiment of the present disclosure may have an increased range of movement, thereby increasing the vibration intensity. Moreover, the configuration of the tactile feedback mechanism of the embodiment of the present disclosure may achieve the effect of miniaturization. Furthermore, the tactile feedback mechanism of the embodiment of the present disclosure may have uniform vibration feedback, and may have various vibration feedbacks at the same time. In addition, the tactile feedback mechanism of the embodiment of the present disclosure may prevent the elements of the tactile feedback mechanism from being damaged due to impact.

Although embodiments of the present disclosure and their advantages have been described in detail, it should be understood that various changes, substitutions and alterations may be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, the scope of the present disclosure is defined by the scope of the appended claims. In addition, each scope of the claims is constructed as a separate embodiment, and various combinations of the claims and combinations of embodiments are within the scope of the present disclosure.

What is claimed is:

1. A tactile feedback mechanism, comprising:
   a movable part, comprising a first weight element;
   a fixed part, wherein the movable part is movable relative to the fixed part;
   a driving assembly, for driving the movable part to move relative to the fixed part; and
   a connecting element,
   wherein the first weight element is made of a metal material,
   wherein the driving assembly comprises a first piezoelectric element having piezoelectric material,
   wherein the first piezoelectric element is disposed on the movable part,
   wherein the first piezoelectric element is movable relative to the fixed part,
   wherein no part of the first piezoelectric element is fixedly connected to the fixed part,
   wherein the first piezoelectric element is at least partially fixedly connected to the first weight element,
   wherein the first piezoelectric element is connected to the first weight element via the connecting element,
   wherein the connecting element is glue or a solder material.

2. The tactile feedback mechanism as claimed in claim 1, wherein the first piezoelectric element penetrates the first weight element.

3. The tactile feedback mechanism as claimed in claim 2, further comprising a first elastic element,
   wherein the movable part is movably connected to the fixed part via the first elastic element,
   wherein the first elastic element has a plate-like structure,
   wherein the driving assembly is electrically connected to an external circuit via the first elastic element,
   wherein the first piezoelectric element is movably connected to the fixed part via the first elastic element.

4. The tactile feedback mechanism as claimed in claim 2, wherein the first elastic element comprises:
   a first movable part connecting end, fixedly connected to the movable part; and
   a first fixed part connecting end, fixedly connected to a first surface of the fixed part,
   wherein the fixed part comprises a first cover and a first frame,
   wherein the first surface forms a first accommodating space corresponding to the movable part,
   wherein when the movable part is located in a first extreme position relative to the fixed part, the movable part is at least partially located in the first accommodating space,
   wherein when the movable part is located in the first extreme position, the first elastic element is at least partially located in the first accommodating space,
   wherein a second surface of the first accommodating space faces the movable part,
   wherein the driving assembly is used for driving the movable part to move within a range of movement relative to the fixed part,
   when the movable part is located in an arbitrary position in the range of motion, the first movable part connecting end and the first movable part are not in contact with the first surface,
   wherein the first cover is fixedly connected to the first frame,
   wherein the first surface is located on the first frame, and the second surface is located on the first cover,
   wherein the driving assembly is used for driving the movable part to move along a first axis relative to the fixed part;
   wherein the first elastic element at least partially overlaps the first surface when viewed along the first axis,
   wherein the first surface is parallel to the first axis.

5. The tactile feedback mechanism as claimed in claim 4, further comprising a second elastic element,
wherein the second elastic element further comprises:
a second movable part connecting end, fixedly connected to the movable part; and
a second fixed part connecting end, fixedly connected to a third surface of the fixed part,
wherein the fixed part comprises a second cover and a second frame,
wherein the movable part is movably connected to the fixed part via the second elastic element,
wherein the second elastic element has a plate-like structure,
wherein the driving assembly is electrically connected to an external circuit via the second elastic element,
wherein the third surface forms a second accommodating space corresponding to the movable part,
wherein when the movable part is located in a second extreme position relative to the fixed part, the movable part is at least partially located in the second accommodating space,
wherein when the movable part is located in the second extreme position, the second elastic element is at least partially located in the second accommodating space,
wherein a fourth surface of the second accommodating space faces the movable part,
wherein when the movable part is located in an arbitrary position in the range of movement, the movable part and the second elastic element are not in contact with the fourth surface,
wherein the second cover is fixedly connected to the second frame,
wherein the third surface is located on the second frame, and the fourth surface is located on the second cover,
wherein the second elastic element at least partially overlaps the third surface when viewed along the first axis,
wherein the third surface is parallel to the first axis.

6. The tactile feedback mechanism as claimed in claim 5, wherein in the first axis, the maximum size of the first accommodating space is different from the maximum size of the second accommodating space,
wherein in the first axis, the maximum distance between the first surface and the second surface is different from the maximum distance between the third surface and the fourth surface.

7. The tactile feedback mechanism as claimed in claim 5, wherein the elastic coefficient of the first elastic element is smaller than the elastic coefficient of the second elastic element,
wherein in the first axis, the maximum size of the first accommodating space is greater than the maximum size of the second accommodating space,
wherein in the first axis, the maximum distance between the first surface and the second surface is greater than the maximum distance between the third surface and the fourth surface.

8. The tactile feedback mechanism as claimed in claim 5, wherein a current of the external circuit flows from the first elastic element to the first piezoelectric element, and the current flows out from the second elastic element.

9. The tactile feedback mechanism as claimed in claim 5, wherein the driving assembly further comprises a second piezoelectric element, wherein a connecting surface of the first piezoelectric element is connected to the first surface of the first weight element, and a connecting surface of the second piezoelectric element is connected to the second surface of the first weight element.

10. The tactile feedback mechanism as claimed in claim 9, wherein a first current of the external circuit flows from the first elastic element to the first piezoelectric element, and the first current flows out from the connecting surface of the first piezoelectric element, wherein a second current of the external circuit flows to the second piezoelectric element from the second elastic element, and the second current flows out from the connecting surface of the second piezoelectric element.

11. The tactile feedback mechanism as claimed in claim 5, wherein the elastic coefficient of the first elastic element and the elastic coefficient of the second elastic element are different.

12. The tactile feedback mechanism as claimed in claim 5, wherein the elastic coefficient of the first elastic element and the elastic coefficient of the second elastic element are the same.

13. The tactile feedback mechanism as claimed in claim 5, wherein the movable part further comprises a second weight element, and the first piezoelectric element penetrates the first weight element and the second weight element.

14. The tactile feedback mechanism as claimed in claim 5, wherein the first weight element is not in contact with the second weight element.

15. The tactile feedback mechanism as claimed in claim 5, wherein a current of the external circuit flows from the first elastic element to the first piezoelectric element, and the current flows out from the second elastic element.

16. The tactile feedback mechanism as claimed in claim 13, wherein the mass of the first weight element and the mass of the second weight element are different, and the elastic coefficient of the first elastic element and the elastic coefficient of the second elastic element are the same.

17. The tactile feedback mechanism as claimed in claim 13, wherein the mass of the first weight element and the mass of the second weight element are different, and the elastic coefficient of the first elastic element and the elastic coefficient of the second elastic element are different.

18. The tactile feedback mechanism as claimed in claim 13, wherein the mass of the first weight element and the mass of the second weight element are the same, and the elastic coefficient of the first elastic element and the elastic coefficient of the second elastic element are different.

19. The tactile feedback mechanism as claimed in claim 13, wherein the first accommodating space and the second accommodating space have different sizes.

* * * * *